(12) United States Patent
Charfi et al.

(10) Patent No.: US 10,339,488 B2
(45) Date of Patent: Jul. 2, 2019

(54) METHOD AND SYSTEM FOR THE DEFINITION OF A MODEL

(71) Applicant: SAP SE, Walldorf (DE)

(72) Inventors: Anis Charfi, Darmstadt (DE); Heiko Witteborg, Griesheim (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 14/971,513

(22) Filed: Dec. 16, 2015

(65) Prior Publication Data

US 2017/0177305 A1 Jun. 22, 2017

(51) Int. Cl.
*G06F 8/10* (2018.01)
*G06Q 10/06* (2012.01)
*G06F 8/35* (2018.01)
*G06F 17/50* (2006.01)

(52) U.S. Cl.
CPC .............. *G06Q 10/067* (2013.01); *G06F 8/10* (2013.01); *G06F 8/35* (2013.01); *G06F 17/50* (2013.01)

(58) Field of Classification Search
CPC ..... G06F 8/31; G06F 8/10; G06F 8/35; G06F 17/50
See application file for complete search history.

(56) References Cited

U.S. PATENT DOCUMENTS

| | | | |
|---|---|---|---|
| 5,995,973 A * | 11/1999 | Daudenarde | G06F 17/30607 |
| 8,448,143 B2 | 5/2013 | Wieczorek et al. | |
| 8,683,434 B2 | 3/2014 | Charfi et al. | |
| 8,832,643 B2 | 9/2014 | Schmeling et al. | |
| 8,868,751 B2 | 10/2014 | Kylau et al. | |
| 9,021,425 B2 | 4/2015 | Aly et al. | |
| 2003/0041069 A1 * | 2/2003 | Yorke | G06F 17/3041 |
| 2003/0191674 A1 * | 10/2003 | Hale | G06Q 30/018 |
| | | | 705/317 |
| 2006/0150169 A1 * | 7/2006 | Cook | G06F 8/10 |
| | | | 717/156 |
| 2006/0242170 A1 * | 10/2006 | Tsyganskiy | G06F 8/72 |
| 2009/0157636 A1 * | 6/2009 | Mackie | G06Q 10/06 |
| 2013/0151317 A1 | 6/2013 | Charfi et al. | |
| 2013/0159354 A1 | 6/2013 | Heinzl et al. | |
| 2014/0067836 A1 | 3/2014 | Holmes et al. | |
| 2015/0067637 A1 | 3/2015 | Charfi et al. | |
| 2015/0293947 A1 * | 10/2015 | Bhagavan | G06F 17/30294 |
| | | | 707/802 |

* cited by examiner

*Primary Examiner* — Wei Y Zhen
*Assistant Examiner* — Amir Soltanzadeh
(74) *Attorney, Agent, or Firm* — Fish & Richardson P.C.

(57) ABSTRACT

The disclosure generally describes methods, software, and systems, including a method for defining and using models. A model definition language is provided for defining models. The model definition language includes elements of a meta-model. The elements define, for a model, a root element of the model and plural participant instances of the model. Each participant instance is linked with the root element. Each participant instance defines at least one of plural participants of the model. Each participant instance is an instance of a participant class. A relation port for the model defines plural relations and flows among the plural participants. Each relation is defined by a relation instance being of a relation class and defining a relationship between participants.

17 Claims, 8 Drawing Sheets

METHOD AND SYSTEM FOR THE DEFINITION OF A MODEL

BACKGROUND

The present disclosure relates to the definition and use of models.

A model can represent a physical object, a process, or some other real or concrete thing. For example, a model of an object, such as a car, can include the components of the car. The model can also include information about interactions between the components, such as between the computer system and the fuel system, between the computer system and the braking system, and between the braking system controls and the actual brakes. In another example, a business model can represent, among other things, a business process of a business, which can be essential for the success of a company. A business model can define several aspects of how a certain company does business and generates revenues. For example, a business model can identify stakeholders (e.g., suppliers and customers), offerings and respective prices (e.g., of products and/or services), value streams, and revenue streams.

Various modeling approaches currently exist. Computer-aided design (CAD) systems may allow, for example, components of a car to be designed. CAD software may also allow primitive interactions between the components to be defined, for example, in a CAD drawing.

In another example, several approaches exist and/or have been proposed regarding the definition of business models using ontologies. The Advanced Imaging Algorithms and Instrumentation (AIAI) enterprise ontology, for example, focuses on the semantic definition of business models by defining activities, processes, organization, strategy and marketing.

Toronto Virtual Enterprise (TOVE) ontologies, for example, are older ontology-based approaches that include a set of integrated ontologies for describing the business model facets associated with activities, time, product design, product requirement constraints, organization, resource, cost, manufacturing activity, manufacturing resource, transportation, quality, inventory and order. For example, TOVE ontologies can focus on the modeling of internal company workflows.

A business model ontology (BMO) is an ontology approach designed for accurate and detailed description of the business of an enterprise. The BMO may be a semi-formal ontology, e.g., described by Web Ontology Language (OWL). Although limited to a single company with regard to the viewing plane, the BMO can provide a comprehensive description of the central consideration organization, related to their partner network, as well as the value proposition, customer groups and financial aspects associated with the enterprise.

Some modeling languages can allow the graphical representation and evaluation of business models in the form of company-wide value networks. The language can be based on a semi-formal ontology, e.g., defined using Unified Modeling Language (UML), Resource Description Framework (RDF) Schema, and/or Prolog. In this approach, it can be possible to infer statements on business rules and profitability. However, the definition of business models may be focused mainly on the actors and the value interactions.

SUMMARY

The disclosure generally describes computer-implemented methods, software, and systems for defining and using a model definition language. A model definition language is provided for defining models. The model definition language includes elements of a meta-model. The elements define, for a model, a single root element of the model and plural participant instances of the model. Each participant instance is contained in the root element. Each participant instance defines at least one of plural participants of the model. Each participant instance is an instance of a participant class. A relation port for the model defines plural relations among the plural participants. Each relation is defined by a relation instance being of a relation class and defining a relationship between participants. The language can be used, for example, to formalize business models so that they can be used for automated processing.

One computer-implemented method includes: providing a model definition language for defining models, the model definition language including elements of a meta-model; defining a model using the model definition language; providing a root element of the model; defining plural participant instances, each participant instance being an instance of a participant class and defining, for each participant instance, at least one of plural participants of the model; linking each participant instance with the root element; providing plural relation port instances of a relation port class, each relation port instance defining relations among two participants of the plural participants, each relation defined by a relation instance being of a relation class; and linking pairs of participant instances using the plural relation port instances.

The foregoing and other implementations can each optionally include one or more of the following features, alone or in combination:

In a first aspect, combinable with any of the previous aspects, the plural participants and the plural relations are named elements, each named element including a name and an optional description.

In a second aspect, combinable with any of the previous aspects, each relation of the plural relations is associated with two participants.

In a third aspect, combinable with any of the previous aspects, each of the plural participants and the plural relations include annotations providing an extensibility mechanism for other facets of the model.

In a fourth aspect, combinable with any of the previous aspects, the participant class is inherited by at least an actor class and a customer segment class, wherein the actor class represents, for an actor instance, an actor being an independent economic entity such as a partner company, an end user, or a person, and wherein the actor has a role in a value chain of the model, the role being one of a provider, an intermediary, a customer, or a stakeholder; and wherein the customer segment class represents, for a customer segment instance, a customer group that seeks an offered value proposition associated with the model.

In a fifth aspect, combinable with any of the previous aspects, the relation class is inherited by at least a value flow class and a revenue flow class, wherein the value flow class represents, for a relation instance, a value stream including a value of a flow of goods and/or services to a specific actor or a value proposition to a client group, and wherein the revenue flow class represents, for a relation instance, revenue streams between the participants, the revenue streams including financial flows, each financial flow identifying a monetary amount and a time element.

In a sixth aspect, combinable with any of the previous aspects, the method further comprises providing model information for use in presenting a visual notation to a user, the visual notation: providing display elements representing elements of the model definition language and used by the user to interactively build the model; and providing controls and tools for use by the user to define and/or modify the model according to the model definition language.

In a seventh aspect, combinable with any of the previous aspects, user inputs and intermittent states of the model are verified for consistency against the model definition language.

In an eighth aspect, combinable with any of the previous aspects, the method further comprises exporting model information to another system for automated processing.

In a ninth aspect, combinable with any of the previous aspects, the model definition language is a business model definition language for defining business models.

The subject matter described in this specification can be implemented in particular implementations so as to realize one or more of the following advantages. A well-defined language using a meta-model can improve the definition process of models, including physical models and business models. Tools that are based on the language can allow users to create a model in a consistent way. The language and language elements described herein can provide a precise unambiguous definition of business models, e.g., so that the business models can be processed automatically by a computer program. For example, information processed automatically from business models can be used to check and validate business models, generate documents and/or code, and configure information technology systems (e.g., for billing, accounting, and revenue sharing). Business models that are created using the described language and respective tools can be used for other purposes such as communication and documentation. Other advantages will be apparent to those of ordinary skill in the art.

The details of one or more implementations of the subject matter of this specification are set forth in the accompanying drawings and the description below. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

Figure 1:
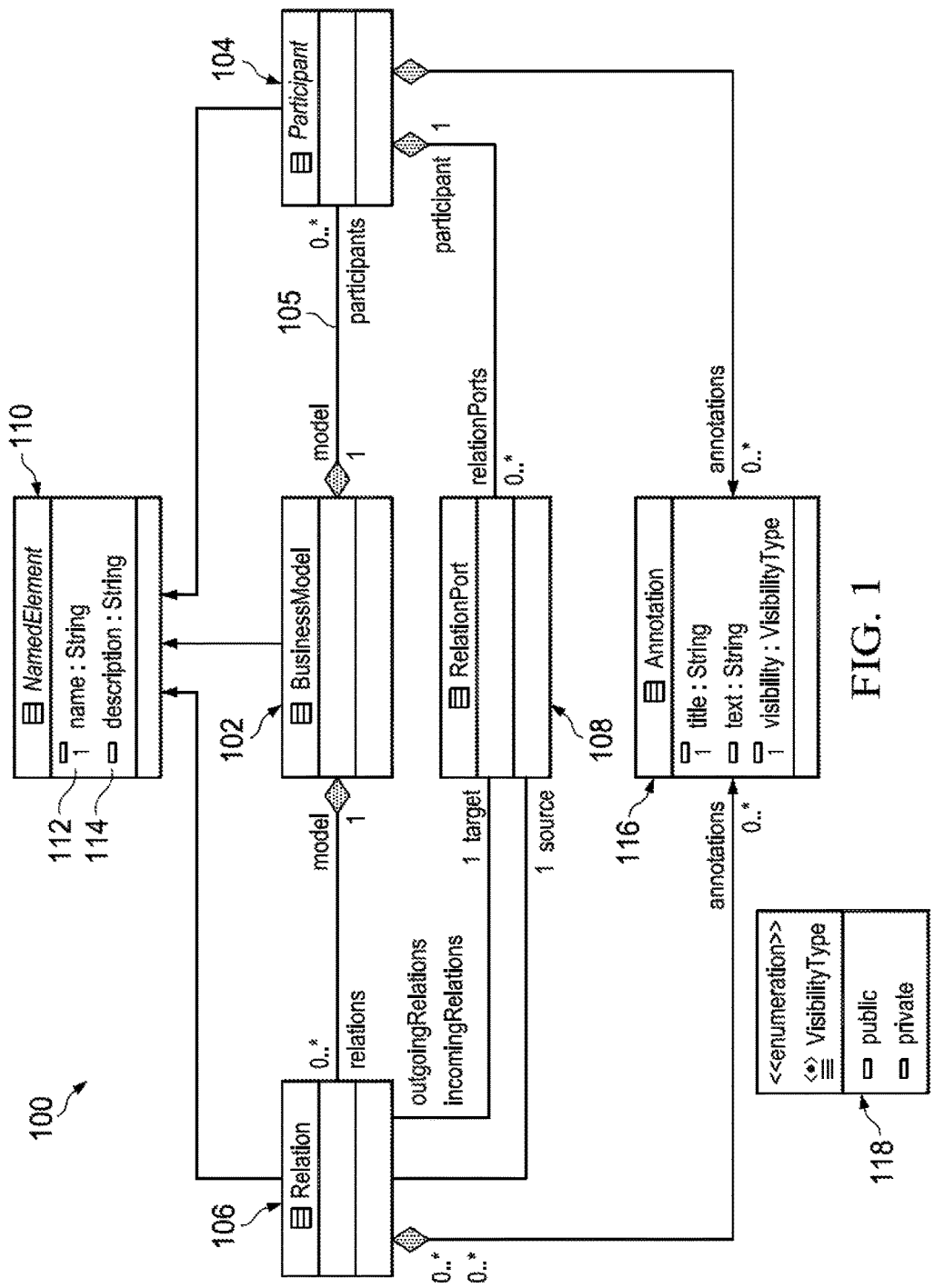
FIG. 1 is a class model illustrating example base concepts of a language used for defining and formalizing a business model, according to an implementation.

This disclosure generally describes computer-implemented methods, software, and systems for defining and using a model definition language. A model definition language is provided for defining models, such as to define relationships and other aspects of components of the model. The model definition language includes elements of a meta-model, e.g., that are used to define the components of the model in a consistent way, based on the meta-model. The elements define, for a model, a root element of the model and plural participant instances of the model that are linked with the root element. For example, the root element can identify the name and other high-level information associated with the model, and the participants can represent the components of the model. Each participant instance defines at least one of plural participants of the model. For example, a participant instance can identify the participant (or group of participants), including a name and other participant definition information. Each participant instance is an instance of a participant class, e.g., supported by software and data that enforces strong typing of components of the model. A relation port for the model defines plural relations and flows among the plural participants. For example, each relation is defined by a relation instance of a relation class and can define a relationship between participants. In some implementations, application software can provide user interfaces for users of the model definition language to generate, modify and use models that are consistent with the definition language and the underlying meta-model.

In some implementations, the computer-implemented methods, software, and systems described herein can be used for specifying models using a well-defined language. A business model can define, e.g., for a business process, the involved actors and their relationships, as well as flows associated with value and revenues. The business model can also support the definition of additional information such as operative data (e.g., concrete business processes) or strategic data (e.g., influence factors such as competitors, visions, and goals).

A precise definition of business models can enable their use as a clear, unambiguous communication basis between involved parties, e.g., in a business process. Moreover, the precise definition can allow an automated processing of a business model, e.g., to analyze the business model (e.g., to detect potential problems and/or possible improvements), to compute certain business model-related metrics, and/or to configure other information technology (IT) systems such as accounting, billing, and/or revenue-sharing systems. The use of business models (e.g., business model canvas (BMC) models) can be helpful with regard to different points of views, e.g., by representing a company as a central company or as a company spanning business network.

In some implementations, key features of business model-related language described herein include, for example, a language for precise definition of business models, a visual notation for business models, and a system for defining business models using a well-defined language. These features can also support exporting business models for their further automated processing (e.g., to detect problems and/or to configure additional information systems). The features can support, for example, a business modeling language, the presentation of a meta-model, the presentation of visualizations associated with business models, and the export of defined business models and associated information.

FIG. 1 is a class model illustrating example components of a metal-model 100, according to an implementation. For example, the metal-model 100 includes components and provides base concepts of a language used for defining and formalizing a business model. For example, FIG. 1 depicts classes of elements (and their relationships) in the meta-model 100 and, as such, FIG. 1 represents a language meta-model associated with business models. The base concepts provide an abstract syntax level, e.g., supporting an explanation of associated language concepts without giving a specific textual or graphical representation.

An important concept in the meta-model 100 is a root element 102 which contains (or is connected to) all other elements of the business model definition, e.g., participant instances of a participant class 104 and associated relation instances of a relations class 106. Relations can be used to identify a relationship between participants, and the relations can be linked (e.g., associated with participants) using instances of relation ports of a relation port class 108. Each relation port can identify, for a given relation, whether the participant is a target or a source of the relation (e.g., which can determine the direction of an arrow when presented in a user interface, as described below). This concept allows the flexible grouping of dependent relations. Conceptually, within the meta-model 100, participants and relations are named elements of a named element class 110, meaning, for example, that the elements have a mandatory name 112 and an optional description field 114.

Participants of a business model based on meta-model 100 are instances of a participant class 104. For example, the participant class 104 can be part of a language (e.g., a computer language) on which the meta-model is defined. Line 105 in the meta-model 100 represents a linking between the root element 102 and a participant of the participant class 104. A relation class 106 defines instances of a relation that define flows between participants. Relations are binary and connect two participants, e.g., using a starting point and a destination point in their relationship over instances of a relation port class 108. Other types of relations are possible. Participants, as well as relations, can also be annotated, e.g., enriched with additional information with annotations of an annotation class 116. Annotations can provide, for example, an extensibility mechanism that allows enrichment of the annotated elements with metadata. As a result, the extension mechanism allows defining other business model facets that are not explicitly covered by the other concepts of the language.

An annotation of the annotation class 116, for example, can include a title (identifying the annotation), text (e.g., for providing a written description for the annotation) and a visibility type (e.g., visibility type 118 of public or private). An annotation, for example, can add information associated with the business model, such as information associated with strategic planning, marketing, human resources, supply chain planning, key performance indicators, costs, profit, and any other factors that are useful in annotating the model. Private/public visibility fields and controls can be provided, for example, to limit the visibility of certain information to different audiences. For example, different visibility settings can be used internally for sensitive information (e.g., profit, costs) and hidden from customers when the model is presented. In addition to public/private controls, additional security controls can exist that limit access and/or different uses of the information to particular users, groups of users or organizations.

Figure 2:
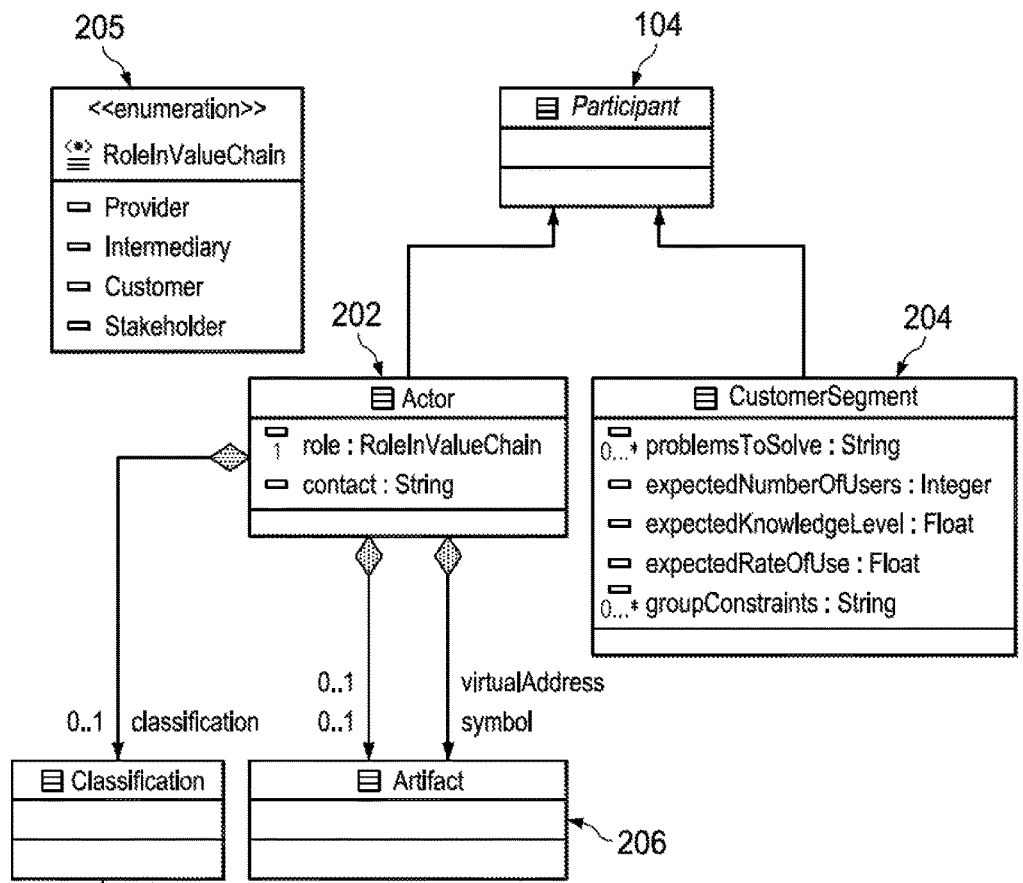
FIG. 2 shows example implementation and specialization details associated with the participant class, according to an implementation.

FIG. 2 shows example implementation and specialization details associated with the participant class 104, according to an implementation. For example, at least two classes can inherit from the participant class 104: an actor class 202 that defines instances of actors, and a customer segment class 204 that defines instances of customer segments, each instance representing a group of individuals (e.g., actors, customers). An actor, for example, can represent a concrete or real-life individual with a defined role and contact information. Defined roles can include, for example, a service provider, a customer, an intermediary, a stakeholder, or some other role in the value chain, e.g., as identified by a role in a value chain enumeration type 205. A customer segment can represent a group of one or more actors, the group having a common characteristic, such as searching for a common product, service or other entity. A customer segment can also be a group of individuals with one or more problems to be solved or have some other similarity that can be desirable to target in a business scenario. Customer segments can have sizes, e.g., a number of members, which can be useful, for example, in producing offers to groups to groups of different customer sizes, customer types, or other characteristics.

An artifact class 206 defines instances of artifacts, each artifact referencing information that is contained in a file or some other physical object outside of the business model. For example, an artifact can be a link to a web page, a link to a document, a symbol, an icon, an image, or some other identifier or object. A classification class 208 can define classifications that are used to map certain elements of the business model to a given taxonomy. For example, a classification can define an actor being classified as a manufacturer, service producer, service provider, or some other actor classification.

The actor class 202 represents an actor that can be any independent economic entity such as a partner company, an end user, or a person. The customer segment class 204 can define a customer segment representing a customer group that seeks a given offered value proposition. The attributes of a customer segment can enable a precise definition and clear delimitation of the addressed customer group.

Figure 3:
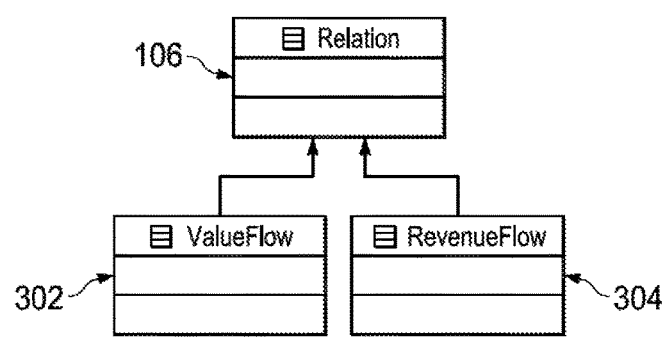
FIG. 3 shows example implementation and specialization details associated with the relation class, according to an implementation.

FIG. 3 shows example implementation and specialization details associated with the relation class 106, according to an implementation. A value flow class 302 represents instances of a value stream such as a flow of goods to a specific actor or a value proposition to a client group. The revenue flow class 304 represents revenue streams, such as financial flows, between the participants.

Figure 4:
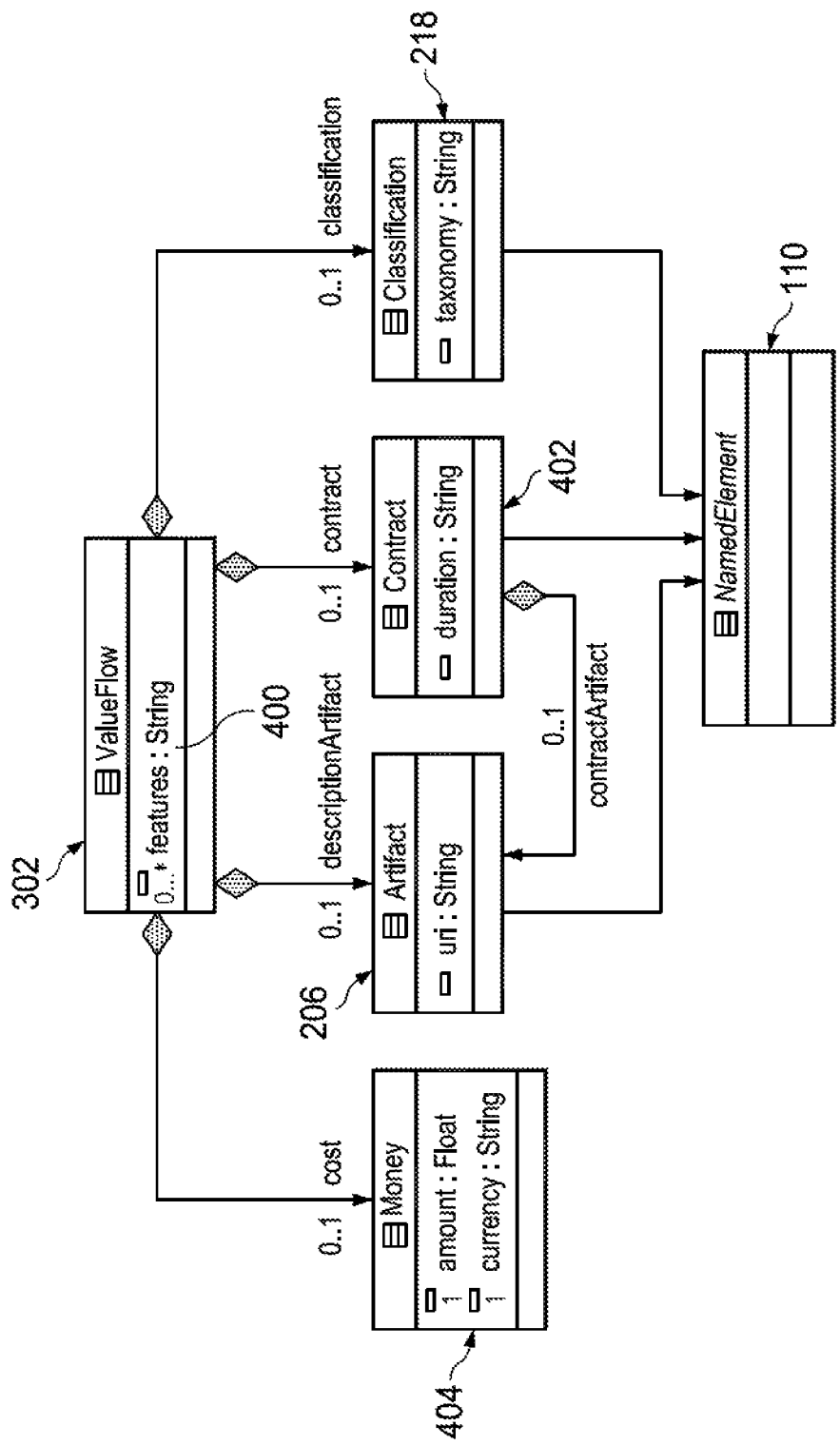
FIG. 4 shows example implementation and specialization details associated with the value flow class, according to an implementation.

FIG. 4 shows example implementation and specialization details associated with the value flow class 302, according to an implementation. Features 400 of a value stream, for example, can support a detailed definition of a value proposition, including attributes related to money, artifacts, contracts and classifications. A contract class 402 can be used to define, for example, instances of a contract representing a binding contract associated with a particular value flow, the contract being a feature 400 of the value flow. A contract, for example, can define a contractual agent associated with a value flow. A contract can also have an associated contract type, e.g., that may be searchable, such as to identify existing models that have contracts of a certain contract type. A money class 404, for example, can be used to define instances of money, each instance representing an amount (e.g. sum) of money and a currency (e.g., US dollars). The artifact class 206 and the classification class 208, described above, can be used for defining corresponding instances of artifacts and classifications respectively that are features 400 of a value flow. In addition to classifications described above, classifications associated with the value flow class 302 can include, for example, an economics class (e.g., for a given country or region), a category of goods or services, offerings of goods or services, or some other classification. In some implementations, classifications can be associated with topics that are searchable by a user, producer, supplier, manufacturer, or other entity. Names of artifacts, contracts and classifications can be implemented as strings, for example, indicating that the artifacts, contracts and classifications are instances of named elements of the named element class 110.

Figure 5:
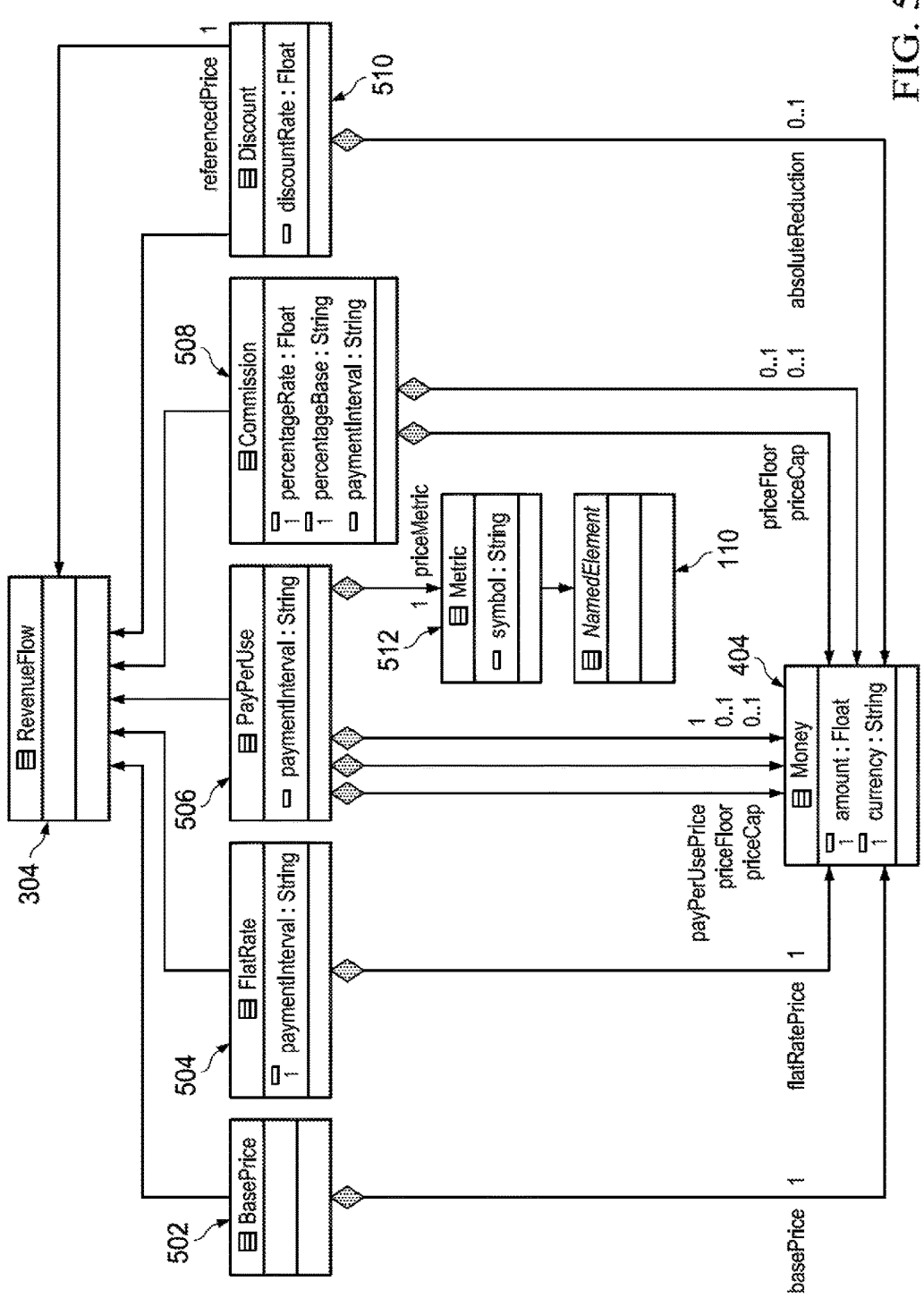
FIG. 5 shows example implementation and specialization details associated with the revenue flow class, according to an implementation.

FIG. 5 shows example implementation and specialization details associated with the revenue flow class 304, according to an implementation. Revenue flows, for example, can define and formalize pricing structures and support the definition of base prices 502, flat rate prices 504, usage-based tariffs 506 (e.g., pay-per-use), commissions 508, and discounts 510, the definition being for a relation that is a revenue flow. The grouping of different revenue flows using a relation port concept can allow the combination of different price components, e.g., the representation of a usage-based tariff with a monthly base fee. Commissions 508 and discounts 510 also correspond to different revenue stream types. Usage-based tariffs 506 can be used, for example, to define a payment interval, such as a per-service-call interval or some other pay-per-use agreement. Each usage-based tariff 506 can have an associated metric 512, e.g., including at least a named element 110 that provides a textual description, such as "per month." Commissions 508 can define commissions, such as for certain basic offering (e.g., pay-per-use), commissions for high-volume transactions/users (e.g., a discount of 20% off the normal price if over 10000 service calls).

FIGS. 6-9 show example visual notations used to represent components of the business model, according to an implementation. For example, FIGS. 6-9 present simple visual notations for the business modeling language as well as show example presentations of instances of classes that comprise the meta-model.

Figure 6:
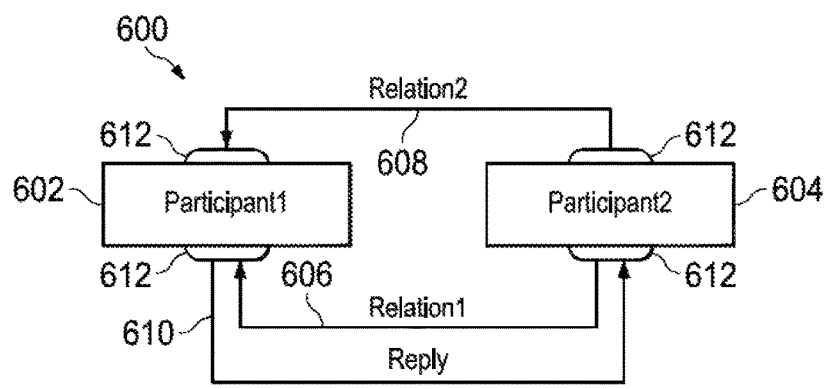
FIG. 6 shows example visual notations provided for participants, relations, and relation ports, according to an implementation.

FIG. 6 shows visual notations provided for participants, relations, and relation ports, according to an implementation. For example, FIG. 6 shows at least part of a business model 600 that includes participants 602 and 604 that have relations 606, 608, 610, shown as directional arrows. The direction of a respective arrow for the relations 606, 608, 610 identifies, for a given relation, whether the participant is a target or a source of the relation. For example, the participant 602 can be a buyer, and the participant 604 can be a seller. The relations 606, 608, 610 can be a mixture of applicable value flows and revenue flows, grouped respective relation ports, with revenue flowing from the buyer, and with value flowing to the seller. The participants 602, 604 can be instances of the participant class 104, and the relations 606, 608, 610 can be instances of the relation class 106, described above. The participant 604 can be an actor of the actor class 202 (e.g., if there is one seller), and the participant 602 can be a customer segment of the customer segment class 204 (e.g., representing multiple buyers or potential customers). Relation ports 612 are depicted as being attached to the participants 602, 604, and each of the relation ports 612 is an instance of the relation port class 108 that defines either the beginning or the ending of a relation flow. In some implementations, the relation ports 612 can serve as controls and/or connection points for defining relations between pairs of participants.

Figure 7:
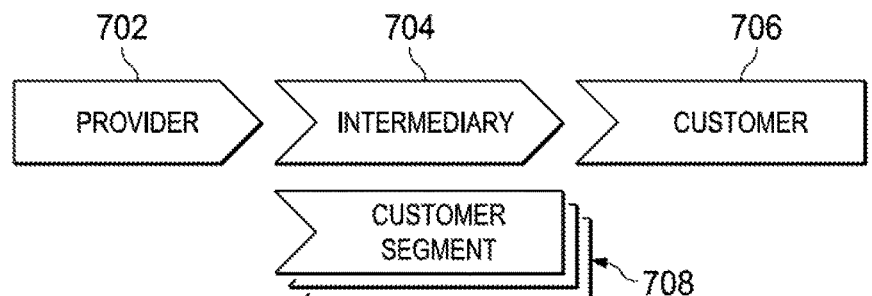
FIG. 7 shows example visual notations for different role types of actors and customer segments, according to an implementation.

FIG. 7 shows example visual notations for different role types of actors and customer segments, according to an implementation. Various symbols used for the visual notations can serve to provide visual cues for each of the various components. For example, a provider 702 is depicted using a symbol having a square beginning (e.g., a left-end shape representing a null input) and a pointed end (e.g., a right-end shape indicating that an output is provided). An intermediary 704, for example, is depicted with a symbol having an open beginning (e.g., a left-end shape indicating that an input is received) and a pointed end (e.g., a right-end shape indicating that an output is provided). A customer 706, for example, is depicted with a symbol having an open beginning (e.g., a left-end shape indicating that an input is received) and a square end (e.g., a right-end shape representing a null output). A customer segment 708 is indicated as a stack of customer symbols.

Figure 8:
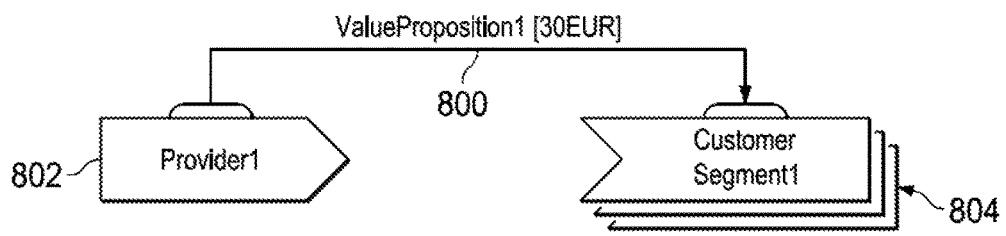
FIG. 8 shows an example visual notation for a value flow, according to an implementation.

FIG. 8 shows an example visual notation for a value flow 800, according to an implementation. For example, a provider 802 provides a value, represented by the value flow 800, to a customer segment 804. The arrow representing the value flow 800 can be annotated, e.g., labeled with detailed information associated with the value flow (e.g., "ValueProposition1[30EUR]").

Figure 9:
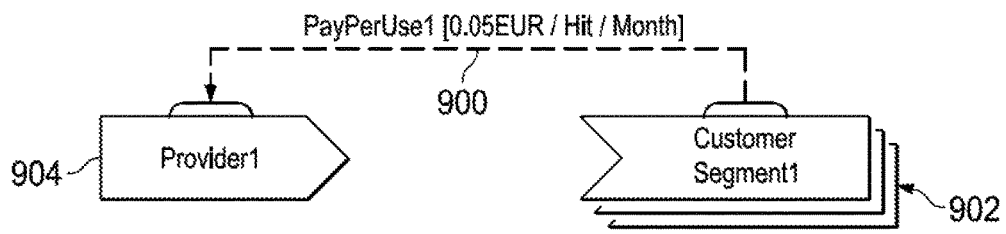
FIG. 9 shows an example visual notation for a revenue flow, according to an implementation.

FIG. 9 shows an example visual notation for a revenue flow 900, according to an implementation. For example, a customer segment 902 provides a revenue flow, represented by the revenue flow 900, to a provider 904. The arrow representing the revenue flow 900 can be annotated, e.g., labeled with detailed information associated with the revenue flow (e.g., "PayPerUse1[0.05EUR/Hit/Month]"). Visual notions representing providers and customer segments can typically have combinations of value flows 800 and revenue flows 900, and not necessarily equal numbers of each, but grouped as needed at a relation port to indicate dependencies.

Figure 10:
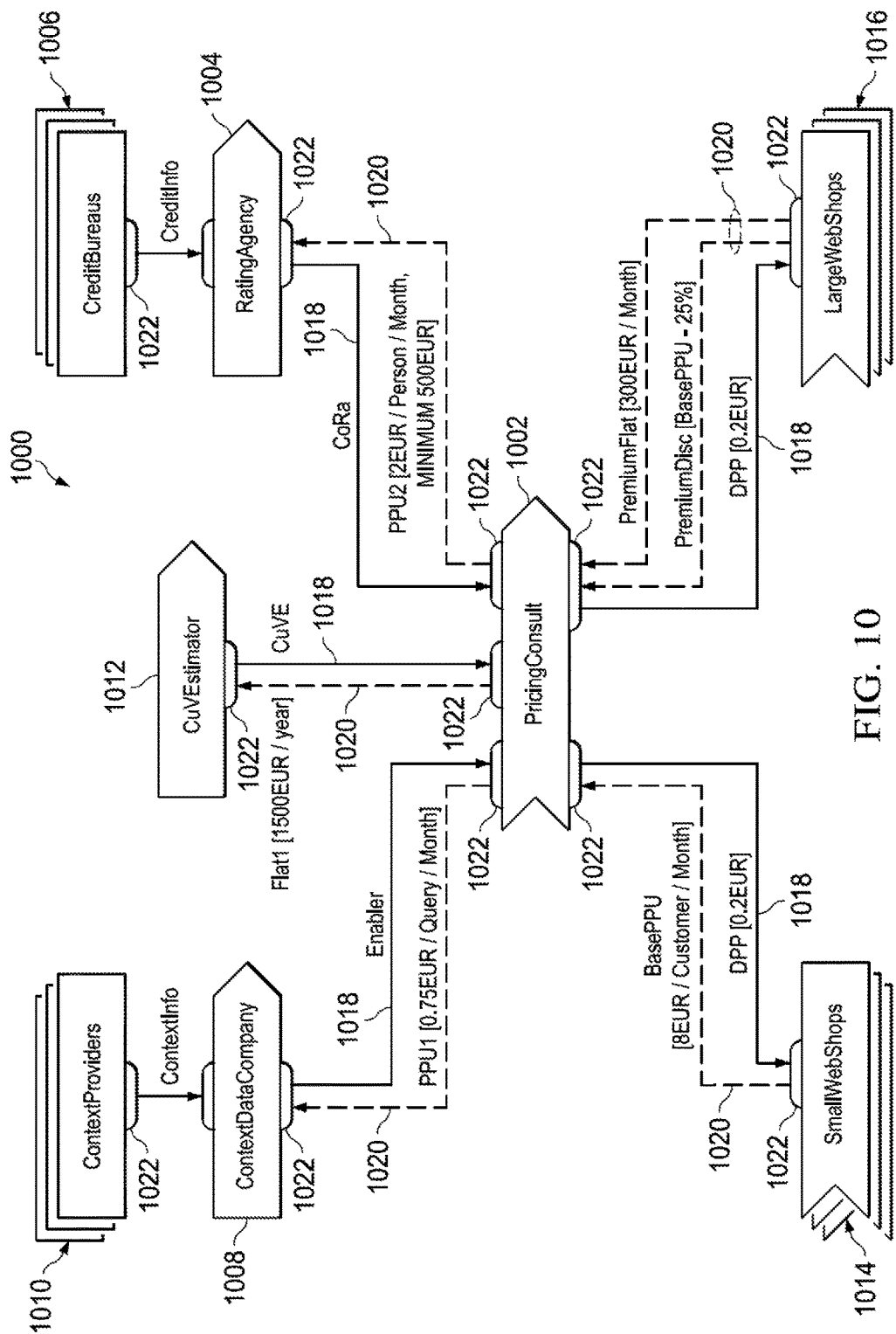
FIG. 10 shows an example visual depiction of a business model, according to an implementation.

FIG. 10 shows an example visual depiction of a business model 1000, according to an implementation. For example, the business model 1000 includes and is associated with an intermediary 1002, e.g., for a fictitious company called "Pricing Consult". The company, for example, may offer electronic services for dynamic pricing to various web shops of different sizes. The company, represented by the intermediary 1002, interacts with other entities, as indicated in the business model 1000. For example, the company may receive customer rating information from a rating agency 1004 (e.g., depicted using a provider symbol) that itself receives information from one or more credit bureaus 1006. The company may also receive context data from a context data company 1008 (e.g., entities that provide location data) that itself receives information from one or more context providers 1010. The company may also receive customer value information from a customer value estimator 1012 that operates as a service for computing customer value based on economic models. The company "Pricing Consult" can offer its services to two main customer segments, e.g., small web shops 1014 and large web shops 1016.

As shown in FIG. 10, the business model 1000 is defined using the language and the notation explained above, including using symbols that have shapes representing specific types of actors and customer segments. This business model 1000 shows not only the participants but also value flows 1018 and revenue flows 1020. Organizational and conceptual grouping of related value flows 1018 and revenue flows 1020 can be achieved, for example, by having the associated arrows originate or connect at the same relation ports 1022, represented as bumps on the participants.

The business model 1000, through the use of various value flows 1018 and revenue flows 1020, enables the conceptual definition and presentation of context-sensitive and/or volume-based pricing. The various pricing arrangements are indicated with different annotations on the two revenue flows 1020 from the large web shops 1016 to the intermediary 1002 (e.g., the company called "Pricing Consult"). Among other information, the services that provide information to the company can include customer rating information which the web shops 1014 and 1016 can use to adjust offerings/prices to customers (e.g., the customer is very valuable and always pays on time). For example, the business model 1000 can support dynamic pricing plans (DPPs).

Figure 11:
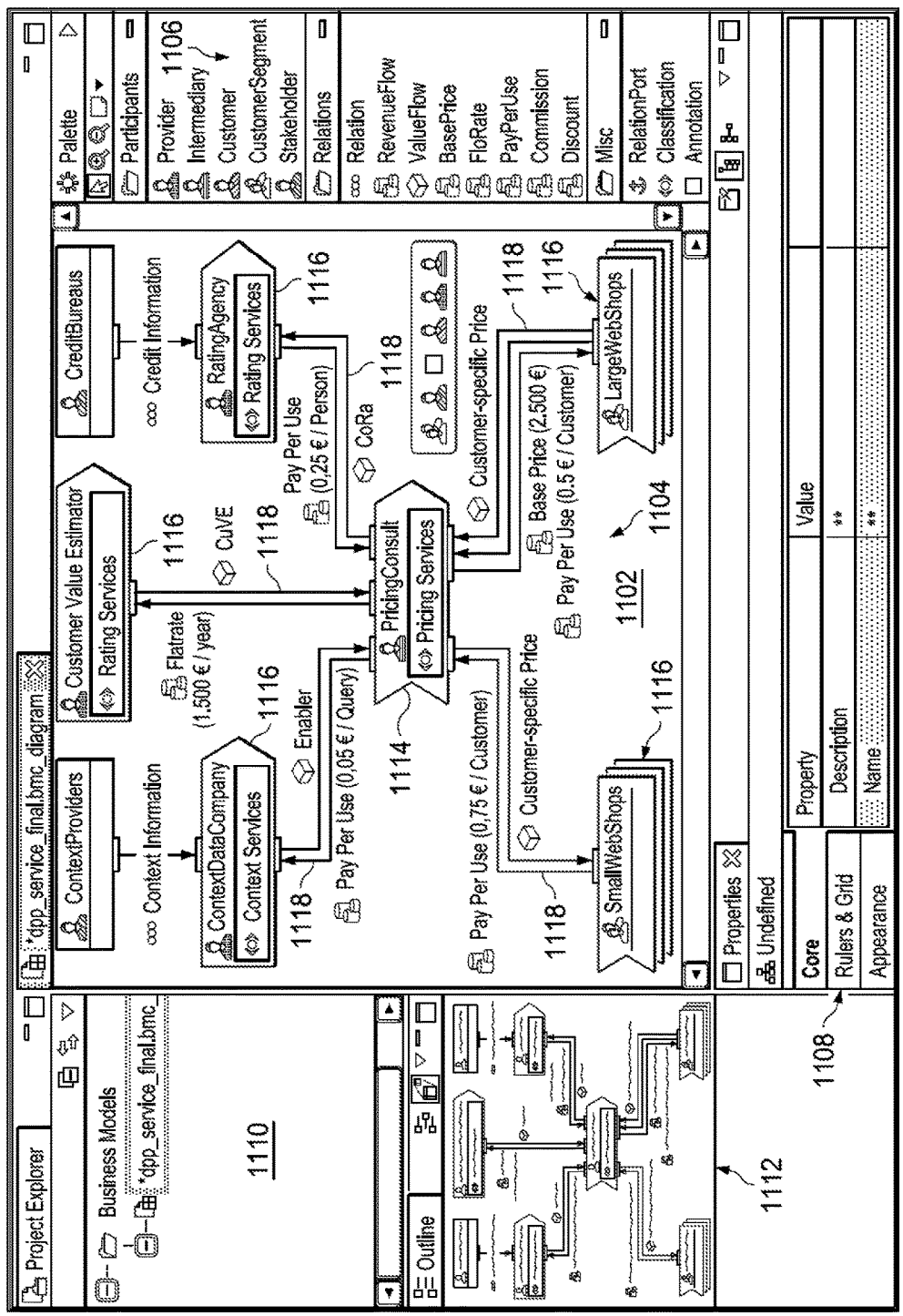
FIG. 11 is a screenshot illustrating an example modeling user interface, according to an implementation.

FIG. 11 is a screenshot illustrating an example modeling user interface 1100, according to an implementation. For example, the modeling user interface 1100 can be used as a tool for business model definition and export. A user can use the modeling user interface 1100 to define business models based on the meta-model language and the visual notations described above. For example, the modeling user interface 1100 can be used to develop the business model 1000. The modeling user interface 1100 can provide a meta-modeling framework and support saving and exporting the defined business models in various formats (e.g., XML). Hence, defined business models can be processed automatically (e.g., by a computer) and/or used to configure other IT systems, such as accounting and revenue-sharing systems.

In some implementations, the modeling user interface 1100 includes an editor pane 1102 in which a business model 1104 is developed using components (e.g., instances of classes described above) from a palette 1106. For example, the user can drag and drop components from the palette 1106 to a canvass, e.g., a location on the business model 1104 in the editor pane 1102. Attributes for the components can be defined in an attributes area 1108. A project explorer area 1110 can be used as a container from which to launch the creation of new business models or to select an existing business model for editing, review, or other use. An outline area 1112 can provide a thumbnail representation of the business model 1104. The outline area 1112 may be especially helpful, for example, if the business model 1104 does not fit in the editor pane 1102 and is partly hidden but accessible using scroll controls along the edges of the editor pane 1102.

The business model 1104 can be used as a tool, for example, to support negotiation, communication between potential customer/provider. For example, by viewing the business model 1104, it can be possible to consider, not just a central company, but the complete business network in a value overview. The business model 1104 can be used internally, e.g., to configure internal processes, to generate code, or in other processes. In some implementations, portions of a business model 1104 can be designated as public or private. For example, public parts can be viewable by anyone having access to the business model. If a portion of a business model is private, for example, it can only be seen by certain people (e.g., developers, managers or others).

Figure 12:
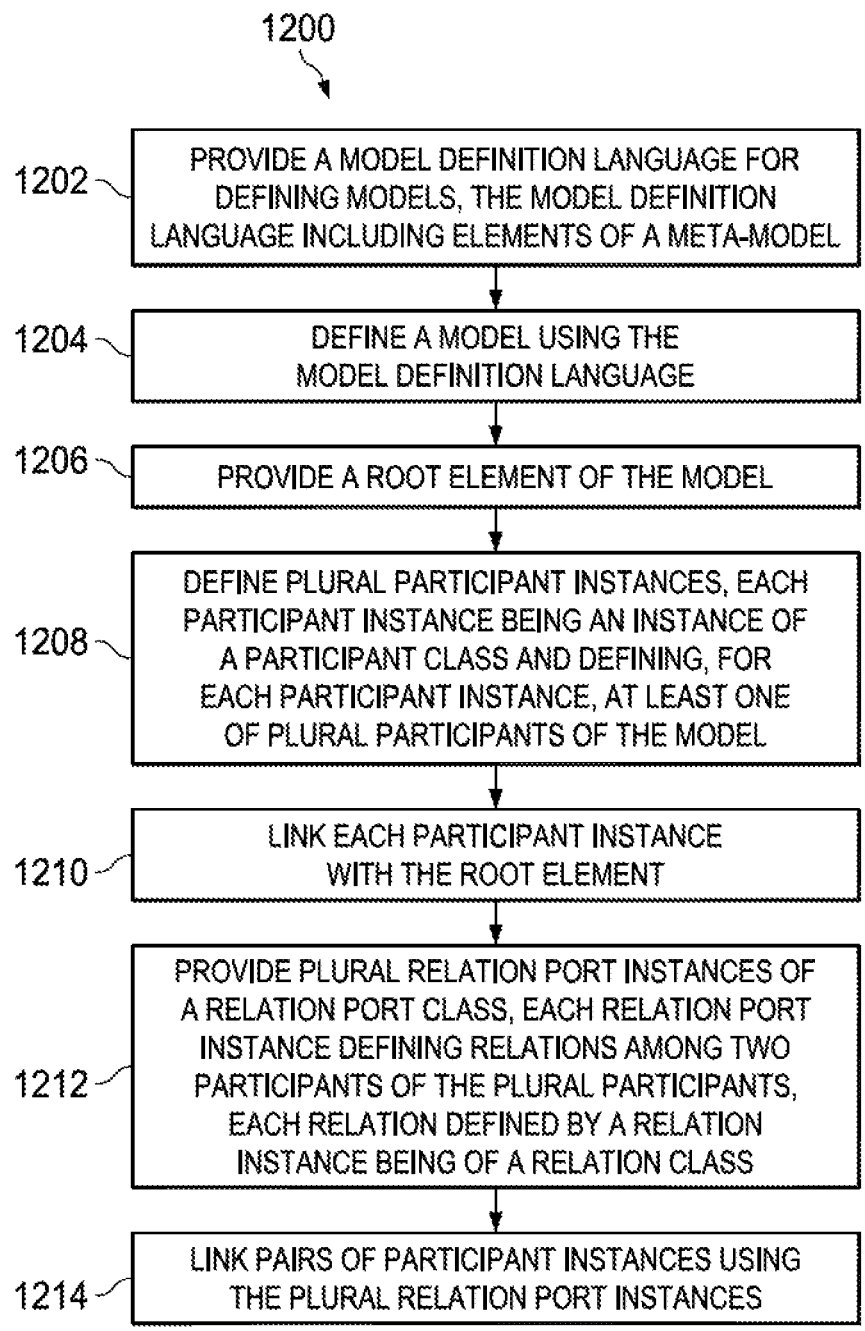
FIG. 12 is a flowchart of an example method for providing and using a model definition language, according to an implementation.

FIG. 12 is a flowchart of an example method 1200 for providing and using a model definition language, according to an implementation. For clarity of presentation, the description that follows generally describes method 1200 in the context of FIGS. 1-11. In some implementations, the model definition language can be a business model definition language for defining business models.

At 1202, a model definition language is provided for defining models. The model definition language includes elements of a meta-model. For example, a model definition language that can be used for defining models in the modeling user interface 1100 can be based on the meta-model 100.

At 1204, a model is defined using the model definition language. For example, using the modeling user interface 1100, a user can define the business model 1104.

At 1206, a root element of the model is provided, e.g., as part of the model definition language. As an example, a root element based on the root element 102 of the meta-model 100 can be defined for business model 1104 and can be associated, for example, with the intermediary 1114. As such, the intermediary 1114 can be a starting point from which the business model 1104 is defined.

At 1208, plural participant instances of the model are defined, each plural participant instance being an instance of a participant class and defining, for each participant instance, at least one of plural participants of the model. For example, through the modeling user interface 1100, participant instances associated with participants 1116 can be defined for the business model 1104. Each of the participants can be represented by a user-selected symbol associated with a user-selected one of the provider 702, the intermediary 704, the customer 706, or the customer segment 708, e.g., selected depending on the type of the participant to be modeled. Each participant can be defined by a participant instance of the instance class 104, which can be either an actor instance (of an actor class 202) or a customer segment instance (of the customer segment class 204).

At 1210, each participant instance is linked with the root element. For example, each of the participants shown in the business model 1104 can be defined by a participant instance of the participant instance class 104. Further, as defined in the meta-model 100, each participant instance of the participant instance class 104 can be linked to the root element 102, e.g., as shown by the line 105 in the meta-model 100.

At 1212, plural relation port instances of a relation port class are provided. For example, each of the relation ports 1022 is represented by an instance of the relation port class 108. Each relation port instance 108 can define a relation among two participants of the plural participants, e.g., participants of the participant class 104. Each relation is defined by a relation instance of a relation class. Value flows 1018 and revenue flows 1020, for example, can represent relations between pairs of the participants 1002, 1004, 1008, 1014, and 1016.

In some implementations, the plural participants and the plural relations are named elements, each named element including a name and an optional description. For example, the participants 1002, 1004, 1008, 1014, and 1016 and their relations (e.g., associated value flows 1018 and revenue flows 1020) can be named according to the named element class 110.

In some implementations, each relation of the plural relations is associated with two participants. For example, each relation can have a target and a source, as indicated by the direction of arrows used to depict the value flows 1018 and revenue flows 1020.

In some implementations, each of the plural participants and the plural relations include annotations providing an extensibility mechanism for other facets of the model. For example, a participant can be defined as an actor (using an actor class 202) or as a customer segment (using a customer segment class 204). As such, the participant class can be inherited by at least an actor class and a customer segment class. Further, as shown in FIG. 2, each actor can have a classification and an artifact. As shown in FIG. 3, a relation instance 106 can be an instance of either a value flow class 302 or a revenue flow class 304. Value flows and revenue flows can be further annotated, as shown in FIGS. 4 and 5, respectively.

In some implementations, the actor class represents, for an actor instance, an actor being an independent economic entity such as a partner company, an end user, or a person, and wherein the actor has a role in a value chain of the model, the role being one of a provider, an intermediary, a customer, or a stakeholder. For example, the actor class can be used to define the participants 1002, 1004, and 1008, each associated with a single entity.

In some implementations, the customer segment class represents, for a customer segment instance, a customer group that seeks an offered value proposition associated with the model. For example, the customer segment class can be used to define the participants 1014 and 1016, each associated with a group representing multiple entities (e.g., related to a common customer base or a supplier base).

In some implementations, the relation class is inherited by at least a value flow class and a revenue flow class. For example, the value flow class 302 can represent, for a relation instance of the relation class 106, a value stream including a value of a flow of goods and/or services to a specific actor or a value proposition to a client group. Specific details associated with the value flow class 302 are described above with reference to FIG. 4. The revenue flow class 304 can represent, for a relation instance of the relation class 106, revenue streams between the participants. The revenue streams can include financial flows, each financial flow identifying a monetary amount and a time element. Specific details associated with the revenue flow class 304 are described above with reference to FIG. 5.

In some implementations, the method 1200 further comprises providing model information for use in presenting a visual notation to a user, the visual notation providing display elements representing elements of the model definition language and used by the user to interactively build the model, the visual notation also providing controls and tools for use by the user to define and/or modify the model according to the model definition language. For example, as described above with reference to FIGS. 7-11, elements of a model can be presented in a consistent way and used in the modeling user interface 1100.

In some implementations, user inputs and intermittent states of the model are verified for consistency against the model definition language. For example, the modeling user interface 1100 can provide tools and controls that ensure that the user produces models that are consistent with the metamodel 100 and the model definition language. Saved and/or current states of the business model 1104, for example, can be verified for consistency.

In some implementations, the method 1200 further comprises exporting model information to another system for automated processing. For example, using a control in the modeling user interface 1100, the user can elect to export information about the business model 1104 (or the entire business model 1104) for use by one or more other systems.

At 1214, pairs of participant instances are linked using the plural relation port instances. For example, instances of the relation port class 108 can define the linking between instances of the participant class 104. The linking can be visually represented, for example, as lines 1118 in the business model 1104.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible, non-transitory computer-storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible, non-transitory computer-storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example, a programmable processor, a computer, or multiple processors or computers. The apparatus can also be or further include special purpose logic circuitry, e.g., a central processing unit (CPU), a FPGA (field programmable gate array), or an ASIC (application-specific integrated circuit). In some implementations, the data processing apparatus and/or special purpose logic circuitry may be hardware-based and/or software-based. The apparatus can optionally include code that creates an execution environment for computer programs, e.g., code that constitutes processor firmware, a protocol stack, a database management system, an operating system, or a combination of one or more of them. The present disclosure contemplates the use of data processing apparatuses with or without conventional operating systems, for example LINUX, UNIX, WIN- DOWS, MAC OS, ANDROID, IOS or any other suitable conventional operating system.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., a CPU, a FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM) or both. The essential elements of a computer are a CPU for performing or executing instructions and one or more memory devices for storing instructions and data. Generally, a computer will also include, or be operatively coupled to, receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a global positioning system (GPS) receiver, or a portable storage device, e.g., a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, e.g., erasable programmable read-only memory (EPROM), electrically-erasable programmable read-only memory (EEPROM), and flash memory devices; magnetic disks, e.g., internal hard disks or removable disks; magneto-optical disks; and CD-ROM, DVD+/−R, DVD-RAM, and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), LCD (liquid crystal display), LED (Light Emitting Diode), or plasma monitor, for displaying information to the user and a keyboard and a pointing device, e.g., a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of wireline and/or wireless digital data communication, e.g., a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n and/or 802.20, all or a portion of the Internet, and/or any other communication system or systems at one or more locations. The network may communicate with, for example, Internet Protocol (IP) packets, Frame Relay frames, Asynchronous Transfer Mode (ATM) cells, voice, video, data, and/or other suitable information between network addresses.

The computing system can include clients and servers. A client and server are generally remote from each other and typically interact through a communication network. The relationship of client and server arises by virtue of computer programs running on the respective computers and having a client-server relationship to each other.

In some implementations, any or all of the components of the computing system, both hardware and/or software, may interface with each other and/or the interface using an application programming interface (API) and/or a service layer. The API may include specifications for routines, data structures, and object classes. The API may be either computer language independent or dependent and refer to a complete interface, a single function, or even a set of APIs. The service layer provides software services to the computing system. The functionality of the various components of the computing system may be accessible for all service consumers using this service layer. Software services provide reusable, defined business functionalities through a defined interface. For example, the interface may be software written in JAVA, C++, or other suitable language providing data in extensible markup language (XML) format or other suitable format. The API and/or service layer may be an integral and/or a stand-alone component in relation to other components of the computing system. Moreover, any or all parts of the service layer may be implemented as child or sub-modules of another software module, enterprise application, or hardware module without departing from the scope of this disclosure.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation and/or integration of various system modules and components in the implementations described above should not be understood as requiring such separation and/or integration in all implementations, and it should be understood that the described program components and systems can generally be integrated together in a single software product or packaged into multiple software products.

Particular implementations of the subject matter have been described. Other implementations, alterations, and permutations of the described implementations are within the scope of the following claims as will be apparent to those skilled in the art. For example, the actions recited in the claims can be performed in a different order and still achieve desirable results.

Accordingly, the above description of example implementations does not define or constrain this disclosure. Other changes, substitutions, and alterations are also possible without departing from the spirit and scope of this disclosure.

What is claimed is:

1. A computer-implemented method comprising:
providing, by one or more processors, a model definition language for defining models, the model definition language comprising elements of a meta-model and base concepts providing an abstract syntax level, by supporting an explanation of associated language concepts without providing a specific textual or a graphical representation, the elements defining, for a model:
a root element of the model comprising an identifier of the model and high-level information associated with the model, the root element of the model being linked to all other elements of the meta-model,
a plurality of participant instances of the model, each participant instance: defining at least one participant of a plurality of participants of the model, and being defined by a participant class, and
a relation between two participant instances, wherein the relation defines flows between the two participant instances that enable conceptual definition and presentation of model-related metrics based on a context, the relation being binary, being defined by a relation class, and defining a relationship between the two participant instances, and wherein instances of the relation class attached to each of the two participant instances are defined as relationship ports that link the relation to the two participant instances, each relationship port being configured to define relations between a pair of participant instances and to identify whether a particular participant instance is a target or a source of the relation, each of the model-related metrics comprising a textual description of a quantifiable measure of at least a named element;
generating, by the one or more processors, a graphical user interface presenting display elements representing elements of the model definition language to ensure consistency with the meta-model and the model definition language when interactively building the model with the graphical user interface and controls and tools used to define or modify the model according to the model definition language;
processing, by the one or more processors, the model, by verifying a consistency against the model definition language, to automatically detect and correct potential problems of the model; and
deploying, by the one or more processors, the model to an external system, to measure the model-related metrics.

2. The method of claim 1, wherein the model, the plurality of participants, and the relation are named elements, each named element including a name and an optional description.

3. The method of claim 1, wherein each of the plural participants and the includes include annotations providing an extensibility mechanism for other facets of the model.

4. The method of claim 1, wherein the participant class is inherited by at least an actor class and a customer segment class;
wherein the actor class represents, for an actor instance, an actor being an independent economic entity such as a partner company, an end user, or a person, and wherein the actor has a role in a value chain of the model, the role being one of a provider, an intermediary, a customer, or a stakeholder; and wherein the customer segment class represents, for a customer segment instance, a customer group that seeks an offered value proposition associated with the model.

5. The method of claim 1, wherein the relation class is inherited by at least a value flow class and a revenue flow class;

wherein the value flow class represents, for a relation instance, a value stream including a value of a flow of goods and/or services to a specific actor or a value proposition to a client group; and wherein the revenue flow class represents, for a relation instance, revenue streams between the participants, the revenue streams including financial flows, each financial flow identifying a monetary amount and a time element.

6. The method of claim 1, further comprising:

providing model information for use in presenting a visual notation to a user, the visual notation:

providing the display elements representing the elements of the model definition language and used by the user to interactively build the model; and providing the controls and tools for use by the user to define or modify the model according to the model definition language.

7. The method of claim 6, wherein verifying the consistency comprises verifying user inputs and intermittent states of the model against the model definition language.

8. The method of claim 1, further comprising:

exporting model information to another system for automated processing.

9. The method of claim 1, wherein the model definition language is exportable in a format that enables automatic computer processing.

10. A system comprising:

one or more processors; and a non-transitory, computer-readable storage medium storing instructions executable by the one or more processors to perform operations comprising:

providing a model definition language for defining models, the model definition language comprising elements of a meta-model and base concepts providing an abstract syntax level, by supporting an explanation of associated language concepts without providing a specific textual or a graphical representation, the elements defining, for the model:

a root element of the model comprising an identifier of the model and high-level information associated with the model, the root element of the model being linked to all other elements of the meta-model, a plurality of participant instances of the model, each participant instance: defining at least one participant of a plurality of participants of the model, and being defined by a participant class, and a relation between two participant instances, wherein the relation defines flows between the two participant instances that enable conceptual definition and presentation of model-related metrics based on a context, the relation being binary, being defined by a relation class, and defining a relationship between the two participant instances, and wherein instances of the relation class attached to each of the two participant instances are defined as relationship ports that link the relation to the two participant instances, each relationship port being configured to define relations between a pair of participant instances and to identify whether a particular participant instance is a target or a source of the relation, each of the model-related metrics comprising a textual description of a quantifiable measure of at least a named element;

generating a graphical user interface presenting display elements representing elements of the model definition language to ensure consistency with the meta-model and the model definition language when interactively building the model with the graphical user interface and controls and tools used to define or modify the model according to the model definition language;

processing the model, by verifying a consistency against the model definition language, to automatically detect and correct potential problems of the model; and deploying the model to an external system, to measure the model-related metrics.

11. The system of claim 10, wherein the model, the plurality of participants, and the relation are named elements, each named element including a name and an optional description.

12. The system of claim 10, wherein each of the plural participants and the relation includes annotations providing an extensibility mechanism for other facets of the model.

13. The system of claim 10, wherein the participant class is inherited by at least an actor class and a customer segment class;

wherein the actor class represents, for an actor instance, an actor being an independent economic entity such as a partner company, an end user, or a person, and wherein the actor has a role in a value chain of the model, the role being one of a provider, an intermediary, a customer, or a stakeholder; and wherein the customer segment class represents, for a customer segment instance, a customer group that seeks an offered value proposition associated with the model.

14. A non-transitory computer-readable storage medium coupled to one or more processors and having instructions stored thereon which, when executed by the one or more processors, cause the one or more processors to perform operations comprising:

providing a model definition language for defining models, the model definition language comprising elements of a meta-model and base concepts providing an abstract syntax level, by supporting an explanation of associated language concepts without providing a specific textual or a graphical representation, the elements defining, for the model:

a root element of the model comprising an identifier of the model and high-level information associated with the model, the root element of the model being linked to all other elements of the meta-model, a plurality of participant instances of the model, each participant instance: defining at least one participant of a plurality of participants of the model, and being defined by a participant class, and a relation between two participant instances, wherein the relation defines flows between the two participant instances that enable conceptual definition and presentation of model-related metrics based on a context, the relation being binary, being defined by a relation class, and defining a relationship between the two participant instances, and wherein instances of the relation class attached to each of the two participant instances are defined as relationship ports that link the relation to the two participant instances, each relationship port being configured to define relations between a pair of participant instances and to identify whether a particular participant instance is a target or a source of the relation, each of the model-related metrics comprising a textual description of a quantifiable measure of at least a named element;

generating a graphical user interface presenting display elements representing elements of the model definition language to ensure consistency with the meta-model and the model definition language when interactively building the model with the graphical user interface and controls and tools used to define or modify the model according to the model definition language;

processing the model, by verifying a consistency against the model definition language, to automatically detect and correct potential problems of the model; and deploying the model to an external system, to measure the model-related metrics.

15. The non-transitory computer-readable storage medium of claim 14, wherein the model, the plurality of participants, and the relation are named elements, each named element including a name and an optional description.

16. The non-transitory computer-readable storage medium of claim 14, wherein each of the plural participants and the relation includes annotations providing an extensibility mechanism for other facets of the model.

17. The non-transitory computer-readable storage medium of claim 14, wherein the participant class is inherited by at least an actor class and a customer segment class;
wherein the actor class represents, for an actor instance, an actor being an independent economic entity such as a partner company, an end user, or a person, and wherein the actor has a role in a value chain of the model, the role being one of a provider, an intermediary, a customer, or a stakeholder; and
wherein the customer segment class represents, for a customer segment instance, a customer group that seeks an offered value proposition associated with the model.

* * * * *